(12) United States Patent
Nobusa et al.

(10) Patent No.: US 11,139,326 B2
(45) Date of Patent: Oct. 5, 2021

(54) PHOTODETECTOR, PHOTODETECTION DEVICE, LASER IMAGING DETECTION AND RANGING APPARATUS

(71) Applicant: Kabushiki Kaisha Toshiba, Minato-ku (JP)

(72) Inventors: Yuki Nobusa, Yokohama (JP); Ikuo Fujiwara, Yokohama (JP); Kazuhiro Suzuki, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 574 days.

(21) Appl. No.: 15/912,997

(22) Filed: Mar. 6, 2018

(65) Prior Publication Data
US 2019/0088691 A1   Mar. 21, 2019

(30) Foreign Application Priority Data

Sep. 15, 2017  (JP) .............................. JP2017-178189
Jan. 30, 2018  (JP) .............................. JP2018-013975

(51) Int. Cl.
*H01L 27/14*    (2006.01)
*H01L 27/144*   (2006.01)
(Continued)

(52) U.S. Cl.
CPC ........ *H01L 27/1443* (2013.01); *G01S 7/4863* (2013.01); *G01S 17/10* (2013.01);
(Continued)

(58) Field of Classification Search
CPC ............. H01L 27/1443; H01L 31/1804; H01L 31/02327; H01L 31/035281; H01L 31/107; H01L 31/02161; G01S 7/4816
See application file for complete search history.

(56) References Cited

U.S. PATENT DOCUMENTS 7,333,182 B2   2/2008  Tanaka et al.
8,071,415 B2 * 12/2011  Okamura .............. H01L 27/144
                                                   438/59
(Continued)

FOREIGN PATENT DOCUMENTS

CN   108389872 A   8/2018
JP    60-97681 A   5/1985
(Continued)

OTHER PUBLICATIONS

Japanese Office Action dated Jun. 26, 2020 in Japanese Patent Application No. 2018-013975, citing documents AO through AT therein, 3 pages.

*Primary Examiner* — Luke D Ratcliffe
(74) *Attorney, Agent, or Firm* — Oblon, McClelland, Maier & Neustadt, L.L.P.

(57) ABSTRACT

A photodetector includes a first cell converting incident light into electric charges; and a second cell converting incident light into electric charges; wherein the first cell includes a first semiconductor layer and a second semiconductor layer provided to be closer to a light incident side than the first semiconductor layer, wherein the second cell includes a third semiconductor layer and a fourth semiconductor layer provided to be closer to a light incident side than the third semiconductor layer, wherein a first interface between the third semiconductor layer and the fourth semiconductor layer is located to be closer to the light incident side than a second interface between the first semiconductor layer and the second semiconductor layer.

14 Claims, 7 Drawing Sheets

(51) Int. Cl.
  *H01L 31/107*  (2006.01)
  *G01S 7/4863*  (2020.01)
  *G01S 17/10*  (2020.01)
  *H01L 31/101*  (2006.01)
  *H01L 31/0352*  (2006.01)
  *H01L 31/02*  (2006.01)
  *G01S 17/93*  (2020.01)

(52) U.S. Cl.
  CPC .................. *H01L 31/02027* (2013.01); *H01L 31/035272* (2013.01); *H01L 31/107* (2013.01); *H01L 31/1013* (2013.01); *G01S 17/93* (2013.01)

(56) References Cited

U.S. PATENT DOCUMENTS

2016/0005913 A1   1/2016  O'Neill et al.
2017/0086762 A1   3/2017  Kawata et al.
2017/0315218 A1* 11/2017  Yonehara .......... H01L 31/02327

FOREIGN PATENT DOCUMENTS

| JP | 5-206500 A | * | 8/1993 | |
|----|---|---|---|---|
| JP | 9-331080 | | 12/1997 | |
| JP | 2005-265606 | | 9/2005 | |
| JP | 2006-245264 A | | 9/2006 | |
| JP | 2006-318947 A | | 11/2006 | |
| JP | 2007-158036 | | 6/2007 | |
| JP | 2010-232555 A | | 10/2010 | |
| JP | 2014-143447 | * | 7/2014 | ............ H01L 27/14 |
| JP | 2014-143447 A | | 8/2014 | |
| JP | 2017-67634 | | 4/2017 | |

* cited by examiner

PHOTODETECTOR, PHOTODETECTION DEVICE, LASER IMAGING DETECTION AND RANGING APPARATUS

CROSS-REFERENCE TO RELATED APPLICATIONS

This application is based upon and claims the benefit of priority from the prior Japanese Patent Application No. 2017-178189, filed on Sep. 15, 2017 and the prior Japanese Patent Application No. 2018-13975, filed on Jan. 30, 2018, the entire contents of which are incorporated herein by reference

1. FIELD

Embodiments of the present invention relate to a photodetector, a photodetection device, a laser imaging detection and ranging apparatus.

2. BACKGROUND

A laser imaging detection and ranging (LIDAR) apparatus measures a time when laser light reciprocates to return from an object and converts the time into a distance. The distance image sensing system employing a time-of-flight (TOF) distance measurement method is applied to an in-vehicle drive assist system, remote sensing, or the like.

As a problem of the photodetector used in the LIDAR apparatus, in a case where a difference in the amount of light from a subject is large, that is, in a case where a subject distance range is wide, light cannot be accurately detected. For example, in a case where the subject distance is short, the light amount of the reciprocating light increases. When the amount of incident light is too large, the photodetector is always in the photon-detected state, and thus, an SN ratio becomes low, so that the photodetector cannot accurately count photons. Therefore, in a case where the amount of light is large, the photodetector needs to detect incident light with low sensitivity. On the contrary, in a case where the subject distance is long, the light amount of the reciprocating light decreases. When the amount of incident light is too small, the photodetector cannot accurately count photons. Therefore, in a case where the amount of light is small, the photodetector needs to detect light incident with high sensitivity. Therefore, a photodetector capable of accurately detecting light even when a subject distance range is wide is required.

SUMMARY

The embodiment of the invention is to provide a photodetector that accurately detect light even when a subject distance range is wide.

In order to achieve the above object, a photodetector according to an embodiment includes at least one first cell that converts incident light into electric charges, at least one second cell that converts incident light into electric charges, and a separation portion provided between the first cell and the second cell, wherein the first cell includes a first semiconductor layer and a second semiconductor layer provided to be closer to a light incident side than the first semiconductor layer, wherein the second cell includes a third semiconductor layer and a fourth semiconductor layer provided to be closer to the light incident side than the third semiconductor layer, and wherein an interface between the third semiconductor layer and the fourth semiconductor layer is located to be closer to the light incident side than an interface between the first semiconductor layer and the second semiconductor layer.

DETAILED DESCRIPTION

Hereinafter, embodiments of the invention will be described with reference to the drawings. Components denoted by the same reference numerals indicate corresponding ones. The drawings are schematic or conceptual, and a relationship between thickness and width of each portion, a ratio of sizes among portions, and the like are not necessarily the same as actual ones. In addition, even in the case of representing the same portions, the sizes and ratios of the portions may be different from each other depending on figures in the drawings.

First Embodiment

Figure 1:
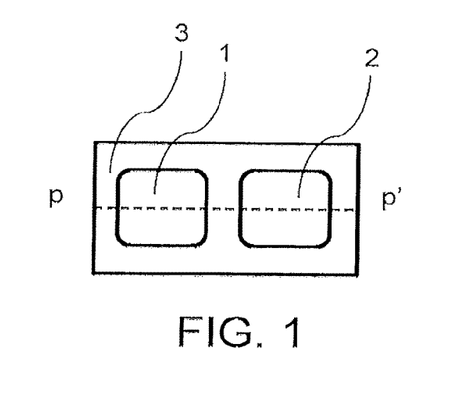
FIG. 1 is a diagram illustrating a photodetector according to a first embodiment.

FIG. 1 is a diagram of a photodetector according to a first embodiment as viewed from a light incident direction.

As illustrated in FIG. 1, the photodetector according to this embodiment includes a short-distance cell 1 (sometimes, referred to as a first cell), a long-distance cell 2 (sometimes, referred to as a second cell), and a separation portion 3. In addition, the photodetector includes at least one short-distance cell 1 and at least one long-distance cell 2, each of which photoelectrically converts light (for example, near-infrared light) incident on each of the short-distance cell 1 and the long-distance cell 2 into electric charges and outputs the photoelectrically-converted electric signal to a driving/reading unit (not illustrated), so that light is detected.

The separation portion 3 is an area for preventing adjacent cells from interfering with each other, is an area in which light incident on the photodetector cannot be detected, and surrounds the short-distance cell 1 and the long-distance cell 2. The separation portion 3 is a wiring area for outputting the electric charges converted by the short-distance cell 1 and the long-distance cell 2 to the driving/reading unit (not illustrated). The material of the wiring is, for example, aluminum, an aluminum-containing material, or other metal materials combined with the material.

Figure 2:
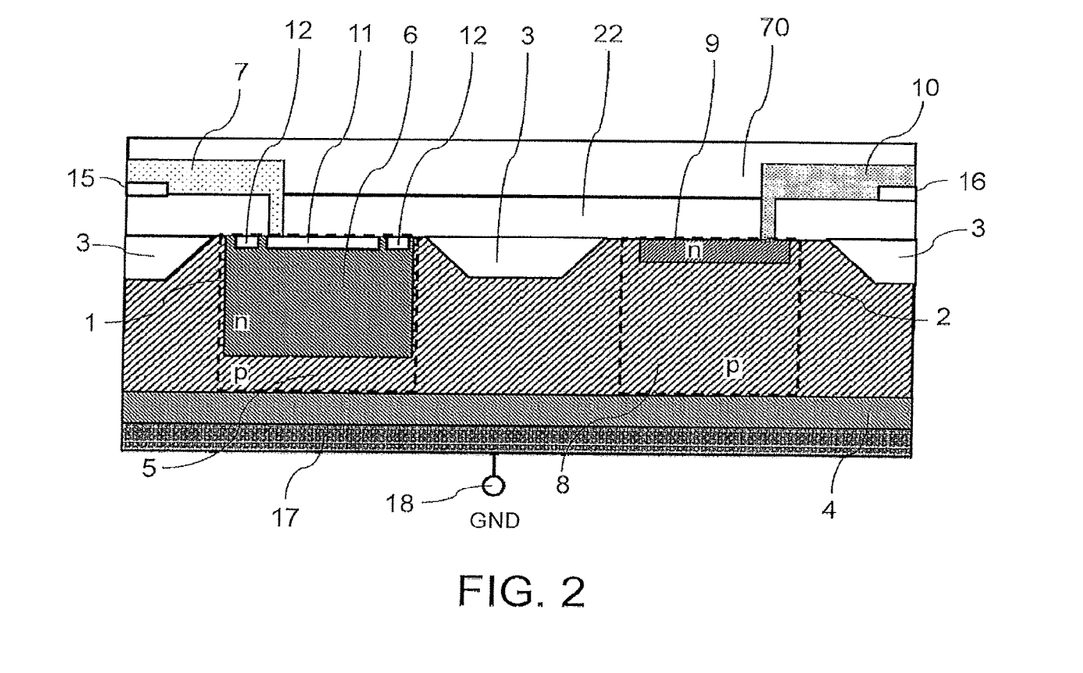
FIG. 2 is a diagram illustrating a p-p' cross section of the photodetector illustrated in FIG. 1.

FIG. 2 is a diagram illustrating a p-p' cross section of the photodetector illustrated in FIG. 1. It is assumed in FIG. 2 that light is incident from the upper side.

The short-distance cell 1 is, for example, an avalanche photodiode (APD) cell using a silicon material that detects light by converting incident light into electric charges. The short-distance cell 1 detects light with low sensitivity (sometimes, referred to as a first sensitivity) when the amount of incident light is larger than a predetermined light amount. As illustrated in FIG. 2, the short-distance cell 1 includes a first semiconductor layer 5 (for example, a p-type semiconductor layer) provided on the substrate 4, a second semiconductor layer 6 (for example, an n-type semiconductor layer) provided to be closer to the light incident side than the first semiconductor layer 5, a fifth semiconductor layer 11 provided so as to be in contact with an upper surface inside the second semiconductor layer 6, and a sixth semiconductor layer 12 provided on the upper surface inside the second semiconductor layer 6 to be separated so as to surround the fifth semiconductor layer 11. Herein, the "upper" indicates the light incident side.

The long-distance cell 2 is, for example, an APD using a silicon material that detects light by converting incident light into electric charges. The long-distance cell 2 detects light with high sensitivity (second sensitivity) when the amount of incident light is smaller than a predetermined light amount. The long-distance cell 2 includes a third semiconductor layer 8 (for example, a p-type semiconductor layer) provided on the substrate 4 and a fourth semiconductor layer 9 (for example, an n-type semiconductor layer) provided to be closer to the light incident side than the third semiconductor layer 8. In this embodiment, the first semiconductor layer 5 and the third semiconductor layer 8 are identical semiconductor layers and have substantially the same impurity concentration.

Further, an oxide film 22 is provided on the short-distance cell 1, the long-distance cell 2, and the separation portion 3. In the oxide film 22, two contact portions are provided on the fifth semiconductor layer 11 and the fourth semiconductor layer 9. In one of the two contact portions, the first electrode 7 is provided so as to be electrically connected to the fifth semiconductor layer 11, and in the other of the two contact portions, the second electrode 10 is provided so as to be electrically connected to the fourth semiconductor layer 9. A first quench resistor 15 is provided between the first electrode 7 and the separation portion 3, and a second quench resistor 16 is provided between the second electrode 10 and the separation portion 3. The first electrode 7 is electrically connected to wiring of the separation portion 3 through the first quench resistor 15, and the second electrode 10 is electrically connected to wiring of the separation portion 3 through the second quench resistor 16. A protective layer 70 is provided on the oxide film 22, the first electrode 7, and the second electrode 10.

Furthermore, a back-surface electrode 17 is provided in a lower portion in the stacking direction of short-distance cell 1 and long-distance cell 2. Herein, the "lower" denotes the opposite side of the light incident side. In addition, the stacking direction is a direction perpendicular to the surface. A ground 18 is electrically connected to the back-surface electrode 17.

Although a total thickness of the short-distance cell 1 and the long-distance cell 2 in the stacking direction is uniform, the gap between the third semiconductor layer 8 and the fourth semiconductor layer 9 (sometimes, referred to as, for example, pn junction or an interface between the semiconductor layers 8 and 9) is provided to be closer to the light incident side than the gap between the first semiconductor layer 5 and the second semiconductor layer 6 (sometimes, referred to as, for example, pn junction or an interface between the semiconductor layers 5 and 6). That is, in the long-distance cell 2, the pn junction plane is located near the first electrode 10.

The first semiconductor layer 5 is formed by ion-implanting impurities into the silicon substrate. The impurity material is, for example, B.

The second semiconductor layer 6 is formed by ion-implanting impurities into the first semiconductor layer 5. The impurity material is, for example, P, As, and Sb.

The third semiconductor layer 8 is formed by ion-implanting impurities into the silicon substrate. The impurity material is, for example, B.

The fourth semiconductor layer 9 is formed by ion-implanting impurities into the third semiconductor layer 8. The impurity material is, for example, P, As, and Sb.

The first electrode 10 is provided so as to apply voltages to the first semiconductor layer 5 and the second semiconductor layer 6 from a power supply to drive these semiconductor layers and to transmit electric charges photoelectrically converted between the first semiconductor layer 5 and the second semiconductor layer 6 to a driving/reading unit (not illustrated). The material of the first electrode 10 is, for example, aluminum or an aluminum-containing material, or other metal materials combined with the material.

The second electrode 7 is provided so as to apply a voltage to the third semiconductor layer 8 and the fourth semiconductor layer 9 from a power supply different from the power supply for applying a voltage to the first electrode to drive these semiconductor layers. In addition, the second electrode 7 is provided so as to transmit electric charges photoelectrically converted between the third semiconductor layer 8 and the fourth semiconductor layer 9 to the driving/reading unit (not illustrated). The material of the second electrode 7 is, for example, aluminum or an aluminum-containing material, or other metal materials combined with the material.

The fifth semiconductor layer 11 is provided so as to lower the contact resistance with respect to the first electrode 7 and is formed by ion-implanting impurities having a concentration higher than that of the second semiconductor layer 6 into the second semiconductor layer 6. The impurity material is, for example, P, As, and Sb.

Since an electric field tends to concentrate on a periphery of the fifth semiconductor layer 11, the sixth semiconductor layer 12 is provided so as to prevent the concentration of electric field and is formed by ion-implanting impurities having a concentration higher than that of the fifth semiconductor layer 11. The impurity material is, for example, P, As, and Sb.

The oxide film 22 is provided so that the first electrode 7 and the second electrode 10 are not short-circuited with peripheral wiring. The material of the oxide film 22 is, for example, a silicon oxide film or a silicon nitride film.

The first quench resistor 15 and the second quench resistor 16 are provided so as to cause voltage drop and gather electric charges flowing out from the first electrode 7 and the second electrode 10.

The back-surface electrode 17 is provided so as to apply a voltage to the first semiconductor layer 5, the second semiconductor layer 6, the third semiconductor layer 8, and the fourth semiconductor layer 9. As the material of the back-surface electrode 17, for example, aluminum or an aluminum-containing material, or other metal materials combined with the material is used.

A ground 18 is provided so as to generate a potential difference.

The protective layer 70 is provided to protect the electrodes 7 and 10 so as not to be short-circuited due to contact with the outside. The material of the protective layer 70 is, for example, a silicon oxide film or a silicon nitride film.

Next, a photodetection operation of the photodetector having the short-distance cell 1 and the long-distance cell 2 will be described.

In a detection standby state, a reverse voltage higher than a breakdown reverse voltage is applied to the APD included in each cell, and the APD is operated in a region called a Geiger mode. Since the gain of the APD during the Geiger mode is such high as $10^5$ to $10^6$, such weak light as one photon can be measured. A phenomenon in which discharge is performed in this Geiger mode is called Geiger discharge.

Resistors are connected in series to each APD, and when one photon is incident and Geiger discharge is performed, since the amplification function by the pn junction terminates due to the voltage drop by the resistors, pulsed charges are obtained. This resistor is called a quench resistor.

In a silicon photomultiplier (SiPM) with APD connected together, each APD performs this function. Therefore, in a case where Geiger discharge occurs in a plurality of APDs, for electric charges of one APD, a charge amount proportional to the number of APDs Geiger-discharged or electric charges of a pulse peak value is obtained. Therefore, since it is possible to measure the number of APDs Geiger-discharged from the charge, that is, the number of photons incident on the SiPM, so that it is possible to measure photons one by one.

Figure 3A:
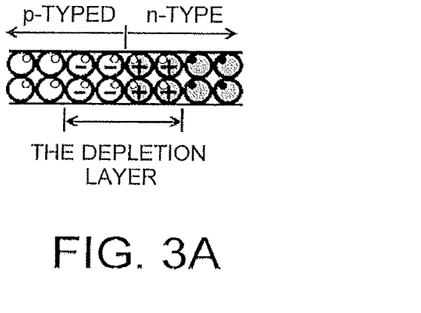
FIGS. 3A and 3B are diagrams illustrating a relationship between an impurity concentration and a depletion layer.
Figure 3B:
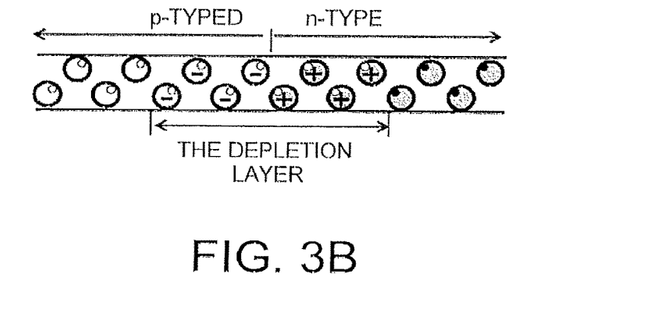

FIG. 3 is a diagram illustrating the relationship between the n-type impurity concentration, the p-type impurity concentration and the depletion layer in a case where n-type impurities and p-type impurities with the same amounts are implanted. FIG. 3(*a*) illustrates a case where the n-type impurity concentration and the p-type impurity concentration are high, and FIG. 3(*b*) illustrates a case where the n-type impurity concentration and the p-type impurity concentration are low.

In general, when the pn junction is in an equilibrium state, the n-type impurities and the p-type impurities are ionized and the carriers are bonded, and that the electric charges disappear, so that a depletion layer is generated. The length of the depletion layer in FIG. 3(*b*) is longer than that in FIG. 3(*a*). That is, as the n-type impurity concentration and the p-type impurity concentration are higher, the length of the depletion layer becomes smaller and as the length of the depletion layer is smaller, the electric field becomes larger. Even if one of the n-type impurity concentration and the p-type impurity concentration is higher, the electric field becomes larger. Since the avalanche probability contributing to the sensitivity of the photodetector increases in proportion to the above-mentioned electric field, the sensitivity of the photodetector is improved. The avalanche probability exhibits the probability of avalanche multiplication.

Figure 4A:
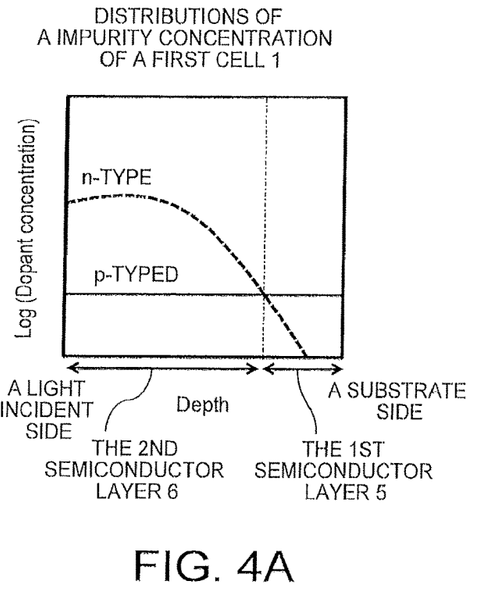
FIGS. 4A and 4B are diagrams illustrating distributions of an n-type impurity concentration and a p-type impurity concentration of a first cell 1 and a second cell 2 at a depth from a light incident side to a substrate side.
Figure 4B:
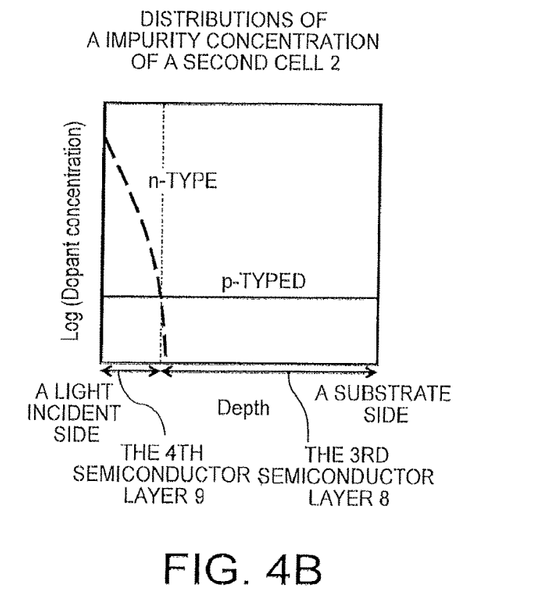

Next, the n-type impurity concentration in the vicinity of a portion (also referred to as, for example, a pn junction or an interface between the semiconductor layers 5 and 6) between the first semiconductor layer 5 and the second semiconductor layer 6 and the n-type impurity concentration in the vicinity of a portion (also referred to as, for example, a pn junction or an interface between the semiconductor layers 8 and 9) between the third semiconductor layer 8 and the fourth semiconductor layer 9 will be described with reference to FIG. 4. Herein, the vicinity denotes a range to the extent of the depletion layer formed by the pn junction.

FIG. 4 is a diagram illustrating distributions of an n-type impurity concentration and a p-type impurity concentration of a first cell 1 and a second cell 2 at a depth from a light incident side to a substrate side.

As illustrated in FIGS. 4(*a*) and 4(*b*), since the first semiconductor layer 5 and the third semiconductor layer 8 have substantially the same impurity concentration in this embodiment, the p-type impurity concentration gradients in the vicinity of the pn junction are almost equal to each other. On the other hand, when comparing the n-type impurity concentration gradients in the vicinity of the pn junction between the second semiconductor layer 6 and the fourth semiconductor layer 9, the n-type impurity concentration gradient of the fourth semiconductor layer 8 is larger. That is, when comparing the n-type impurity concentrations in the vicinity of the pn junction between the second semiconductor layer 6 and the fourth semiconductor layer 9, the n-type impurity concentration gradient of the fourth semiconductor layer 8 is larger. Due to the nature of ion implantation, in the case of implanting impurities with the same amounts, it is easier to diffuse the impurities when implanting the impurities deeply than when implanting the impurities shallowly. AS the pn junction in the stacking direction is deeper, the impurity concentration gradient in the vicinity of the pn junction becomes smaller. Therefore, for the reasons described above, the electric field of the second cell 2 having the fourth semiconductor layer 8 having a larger impurity concentration gradient is larger than that of the first cell 1.

In addition, since the pn junctions are provided at different depths in the first cell 1 and the second cell 2, when a positive voltage is applied from the electrodes 7 and 10, in the first cell 1, avalanche multiplication is caused by holes; and in the second cell 2, avalanche multiplication is caused by electrons. In the case of silicon, the magnitude of the ionization rate ($\alpha$) of the electrons and the magnitude of the ionization rate ($\beta$) of the holes is $\alpha > \beta$, and the proportion of electrons contributing to the avalanche multiplication is higher than the proportion of holes contributing to the avalanche multiplication. Therefore, the avalanche probability of the second cell 2 is higher than that of the first cell 1.

By providing pn junctions at depths indifferent stacking directions as described above, different sensitivities can be achieved.

Figure 5:
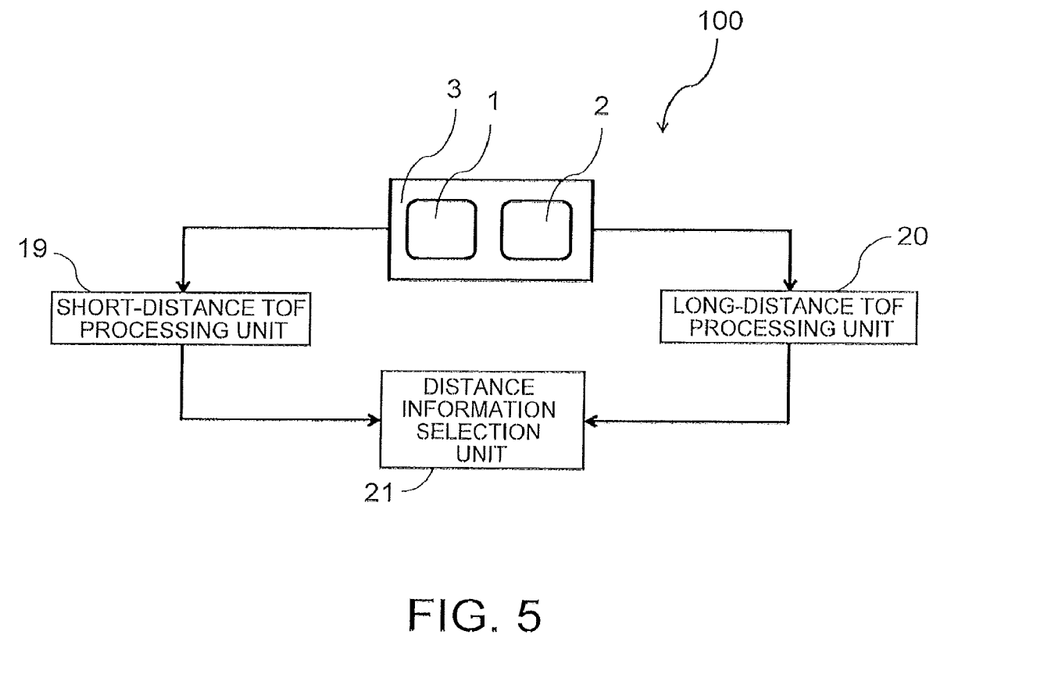
FIG. 5 is a diagram illustrating a photodetection device including the photodetector according to the first embodiment.

FIG. 5 is a diagram illustrating a photodetection device 100 including the photodetector according to the first embodiment.

As illustrated in FIG. 5, the short-distance cell 1 is connected to the short-distance TOF processing unit 19 (sometimes, referred to as a first processing unit) through the wiring of the separation portion 3. The short-distance TOF processing unit 19 calculates charges from the short-distance cell 1 as distance information by using TOF. The calculated distance information is transmitted to the distance information selection unit 21. In addition, the long-distance cell 2 is connected to the long-distance TOF processing unit 20 (sometimes, referred to as a second processing unit) through the wiring of the separation portion 3. The long-distance TOF processing unit 20 calculates charges from the long-distance cell 2 as distance information by using the TOF. The calculated distance information is transmitted to the distance information selection unit 21. The distance information selection unit 21 selects, for example, one having a higher SN ratio from among the distance information of the short-distance cell 1 and the distance information of the long-distance cell 2. An image can be generated by using the selected distance information.

The photodetector according to this embodiment includes the long-distance cell 2 and the short-distance cell 1 corresponding to the subject distance, so that even if the subject distance range is so wide that a general photodetector cannot accurately detect light, it is possible to accurately detect light.

Regardless of the example of FIG. 5, the distance information of the short-distance cell 1 and the distance information of the long-distance cell 2 may be combined by the distance information selection unit 21 as one image. For example, WO 2012/073722 A discloses a synthesis method therefor.

Second Embodiment

Difference from the first embodiment will be described.

Figure 6:
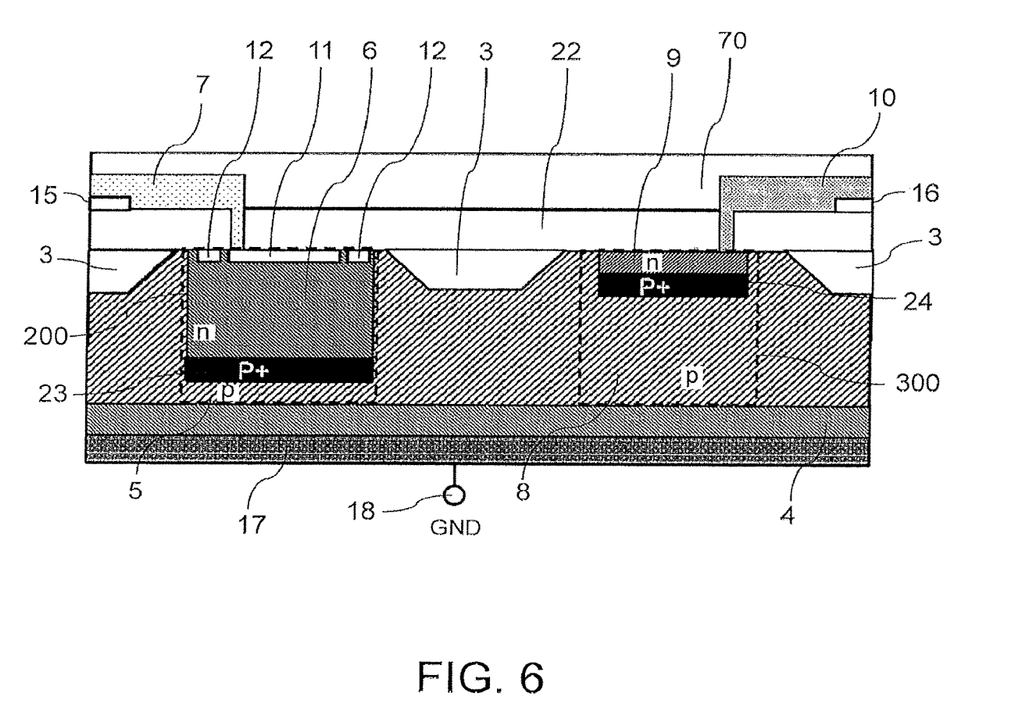
FIG. 6 is a diagram illustrating a p-p' cross section of the photodetector illustrated in FIG. 1.

FIG. 6 is a diagram illustrating a p-p' cross section of the photodetector illustrated in FIG. 1. In FIG. 6, it is assumed that light is incident from the upper side.

As illustrated in FIG. 6, a photodetector according to this embodiment includes a first' cell 200 in which a seventh semiconductor layer 23 having an impurity concentration higher than that of the first semiconductor layer 5 is provided between the first semiconductor layer 5 and the second semiconductor layer 6 of the first embodiment and a second' cell 300 in which an eighth semiconductor layer 24 having an impurity concentration higher than that of the third semiconductor layer 8 is provided between the third semiconductor layer 8 and the third semiconductor layer 8.

The seventh semiconductor layer 23 is formed by ion-implanting impurities having a concentration higher than that of the first semiconductor layer 5 into the first semiconductor layer 5. The impurity material is, for example, B.

The eighth semiconductor layer 24 is formed by ion-implanting impurities having a concentration higher than the third semiconductor layer 8 into the third semiconductor layer 8. The impurity material is, for example, B.

Figure 7:
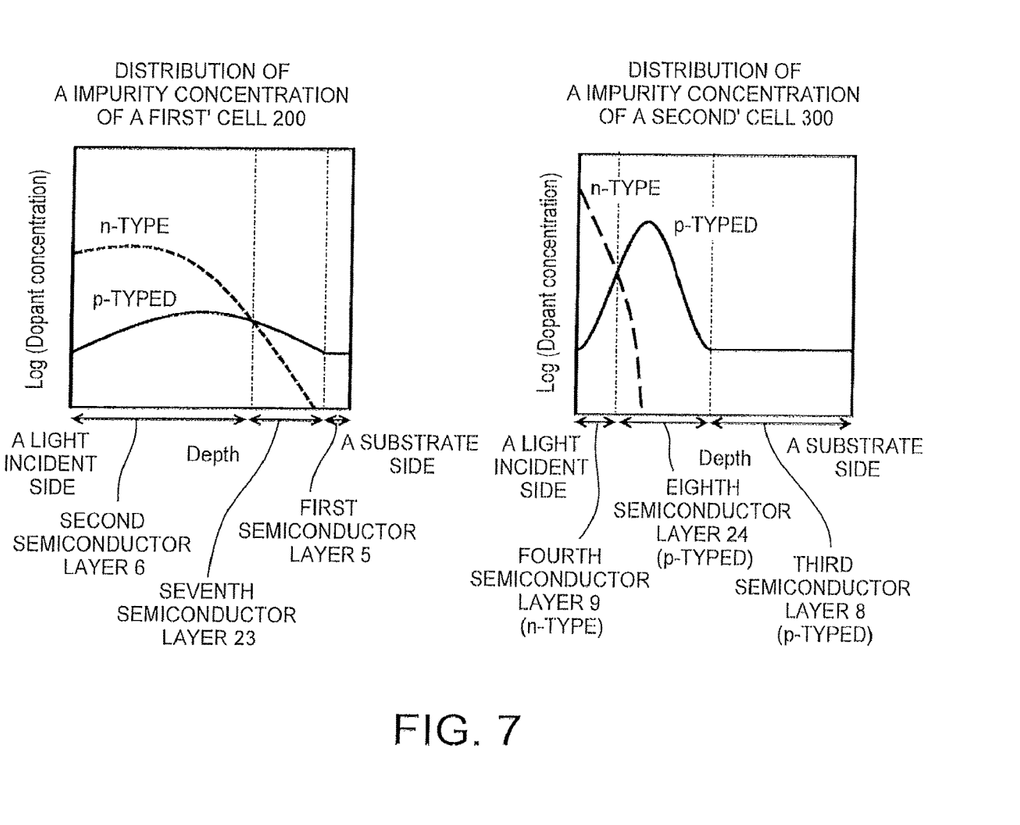
FIG. 7 is a diagram illustrating distributions of an n-type impurity concentration and a p-type impurity concentration of a first' cell 200 and a second' cell 300 at a depth from a light incident side to a substrate side.

FIG. 7 is a diagram illustrating distributions of an n-type impurity concentration and a p-type impurity concentration of a first' cell 200 and a second' cell 300 at a depth from a light incident side to a substrate side.

As illustrated in FIGS. 7($a$) and 7($b$), by providing the seventh semiconductor layer 23 and the eighth semiconductor layer 24, the p-type impurity concentration gradient in the vicinity of the pn junction becomes larger than that of the first embodiment. Therefore, the avalanche probability can be allowed to be higher than that of the first embodiment.

The photodetector according to the present embodiment is provided with a seventh semiconductor layer 23 having an impurity concentration higher than that of the first semiconductor layer 5 between the first semiconductor layer 5 and the second semiconductor layer 6 and an eighth semiconductor layer 24 having an impurity concentration higher than that of the third semiconductor layer 8 between the third semiconductor layer 8 and the third semiconductor layer 8, and a pn junction is formed between the fourth semiconductor layer 9 and the eighth semiconductor layer 24 and between the second semiconductor layer 6 and the seventh semiconductor layer 23. The p-type impurity concentration in the vicinity of the pn junction in the first' cell 200 and the second' cell 300 of this embodiment is higher than the p-type impurity concentration in the vicinity of the pn junction in the first cell 1 and the second cell 2 of the first embodiment. Therefore, for the reasons described above, in the photodetector according to the present embodiment, the electric field is increased, and the sensitivity is improved.

Third Embodiment

Figure 8:
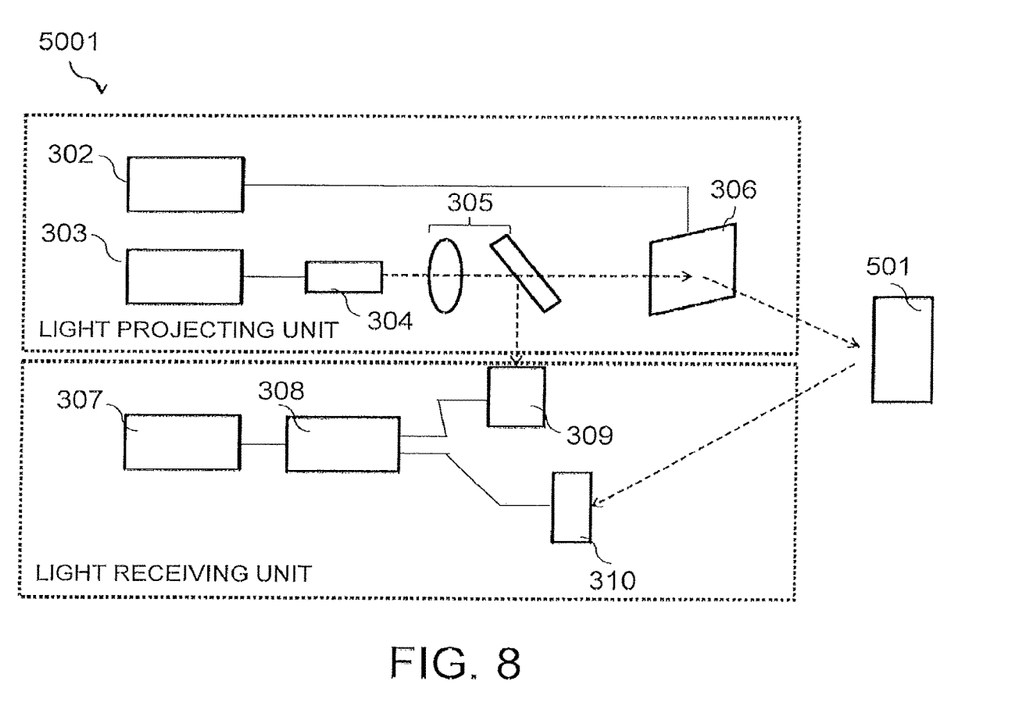
FIG. 8 is a diagram illustrating a LIDAR apparatus according to a second embodiment.

FIG. 8 is a diagram illustrating a LIDAR apparatus 5001 according to a third embodiment.

The LIDAR apparatus 5001 according to this embodiment can be applied to a long-distance subject detection system configured with a line light source, a lens, and the like. The LIDAR apparatus 5001 includes a light projecting unit which projects laser light to the object 501, a light receiving unit which receives the laser light from the object 501, and a time-of-flight (TOF) distance measurement device (not illustrated) which measures a time when the laser light reciprocates to return from the object 501 and reduces the time to a distance.

In the light projecting unit, the laser light oscillator 304 oscillates laser light. A driving circuit 303 drives the laser light oscillator 304. The optical system 305 extracts a portion of the laser light as a reference light and irradiates the object 501 with the other laser light through the mirror 306. The mirror controller 302 controls the mirror 306 to project the laser light onto the object 501. Herein, projecting denotes irradiating with light.

In the light receiving unit, the reference-light photodetector 309 detects the reference light emitted by the optical system 305. The photodetector 310 receives reflected light from the object 501. The distance measurement circuit 308 measures the distance to the object 501 based on the difference between the time when the reference-light photodetector 309 detects the reference light and the time when the photodetector 310 detects the reflected light. The image recognition system 307 recognizes the object 501 based on a result measured by the distance measurement circuit 308.

The LIDAR apparatus 5001 is a distance image sensing system employing a time-of-flight (TOF) distance measurement method which measures a time when the laser light reciprocates to return from the object 501 and reduces the time into a distance. The LIDAR apparatus 5001 is applied to an in-vehicle drive-assist system, remote sensing, or the like. When the photodetectors according to the first and second embodiments are used as the photodetector 310, the photodetector exhibits good sensitivity particularly in a near infrared region. Therefore, the LIDAR apparatus 5001 can be applied to a light source to a wavelength band invisible to a person. For example, the LIDAR apparatus 5001 can be used for detecting obstacles for vehicles.

Figure 9:
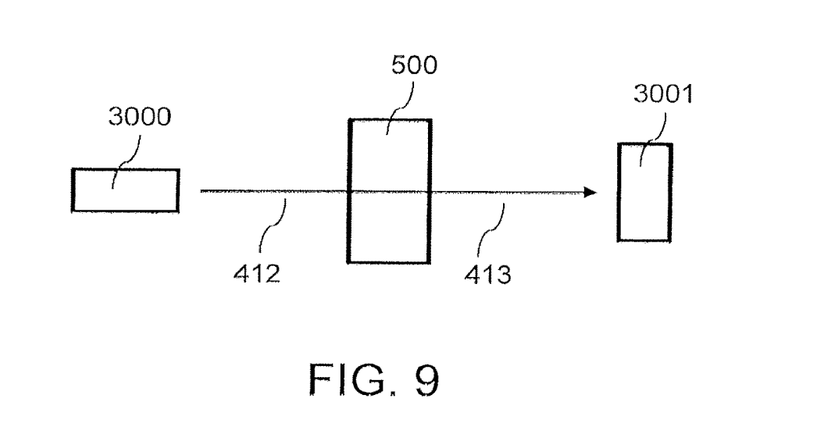
FIG. 9 is a diagram illustrating a measurement system of the LIDAR apparatus of FIG. 8.

FIG. 9 is a diagram illustrating the measurement system.

The measurement system includes at least a photodetector 3001 and a light source 3000. The light source 3000 of the measurement system emits light 412 to the object 501 to be measured. The photodetector 3001 detects the light 413 transmitted through, reflected by, or diffused by the object 501.

For example, when the photodetector 3001 is used as the photodetectors according to the first and second embodiments, a highly sensitive measurement system is embodied.

While several embodiments of the invention have been described above, the above-described embodiments have been presented by way of examples only, and the embodiments are not intended to limit the scope of the invention. The embodiments described herein may be embodied in a variety of other forms; furthermore, various omissions, substitutions, and changes in the form of the embodiments described herein may be made within the scope without departing from the spirit of the invention. The embodiments and modifications thereof are included in the scope and spirit of the invention and fall within the scope of the invention described in the claims and the equivalents thereof.

What is claimed is:

1. A photodetector comprising:
a first cell converting incident light into electric charges;
a second cell converting incident light into electric charges; and
a separation portion provided between the first cell and the second cell,
wherein the first cell includes a first semiconductor layer and a second semiconductor layer provided to be closer to a light incident side than the first semiconductor layer,
wherein the second cell includes a third semiconductor layer and a fourth semiconductor layer provided to be closer to a light incident side than the third semiconductor layer,
wherein a first interface between the third semiconductor layer and the fourth semiconductor layer is located to be closer to the light incident side than a second interface between the first semiconductor layer and the second semiconductor layer,
wherein the first cell and the second cell are an avalanche photodiode cell, and
wherein the first cell detects light with a first sensitivity when the amount of incident light is larger than a predetermined light amount and the second cell detect light with a second sensitivity when the amount of incident light is smaller than a predetermined light amount.

2. The photodetector of claim 1,
wherein a thickness of the first cell and the second cell in a stacking direction is uniform.

3. The photodetector of claim 1,
wherein the avalanche photodiode cell operates in Geiger mode.

4. The photodetector of claim 3,
wherein the light is near-infrared light.

5. The photodetector of claim 4, wherein
the separation portion preventing the first cell and the second cell from interfering with each other.

6. The photodetector of claim 5,
wherein the first semiconductor layer and the third semiconductor layer are identical semiconductor layers.

7. The photodetector of claim 1, further comprising:
a back-surface electrode provided in a lower portion in a stacking direction of the first cell and the second cell.

8. The photodetector of claim 1, wherein the incident light is laser light with a predetermined wavelength.

9. A photodetection device comprising,
a photodetector includes a first cell converting incident light into electric charges, a second cell converting incident light into electric charges and a separation portion provided between the first cell and the second cell, wherein the first cell includes a first semiconductor layer and a second semiconductor layer provided to be closer to a light incident side than the first semiconductor layer, wherein the second cell includes a third semiconductor layer and a fourth semiconductor layer provided to be closer to a light incident side than the third semiconductor layer, wherein a first interface between the third semiconductor layer and the fourth semiconductor layer is located to be closer to the light incident side than a second interface between the first semiconductor layer and the second semiconductor layer;
a first processor calculating charges from the first cell as distance information;
a second processor calculating charges from the second cell as distance information; and
a distance information selector selecting calculated distance information by the first processor and the second processor, and
wherein the first cell and the second cell are an avalanche photodiode cell.

10. The photodetection device of claim 9, wherein
the photodetector further includes a back-surface electrode provided in a lower portion in a stacking direction of the first cell and the second cell.

11. The photodetection device of claim 9, wherein
the incident light is laser light with a predetermined wavelength.

12. The LIDAR apparatus comprising:
a light source emitting light to an object;
a photodetector includes a first cell converting incident light into electric charges, a second cell converting incident light into electric charges and a separation portion provided between the first cell and the second cell, wherein the first cell includes a first semiconductor layer and a second semiconductor layer provided to be closer to a light incident side than the first semiconductor layer, wherein the second cell includes a third semiconductor layer and a fourth semiconductor layer provided to be closer to a light incident side than the third semiconductor layer, wherein a first interface between the third semiconductor layer and the fourth semiconductor layer is located to be closer to the light incident side than a second interface between the first semiconductor layer and the second semiconductor layer;
a first processor calculating charges from the first cell as distance information;
a second processor calculating charges from the second cell as distance information; and
a distance information selector selecting the calculated distance information by the first processor and the second processor, and
wherein the first cell and the second cell are an avalanche photodiode cell.

13. The LIDAR apparatus of claim 12, wherein
the photodetector further includes a back-surface electrode provided in a lower portion in a stacking direction of the first cell and the second cell.

14. The LIDAR apparatus of claim 12, wherein
the light is laser light with a predetermined wavelength.

* * * * *